United States Patent
Kouyanagi (10) Patent No.: US 9,344,030 B2
(45) Date of Patent: May 17, 2016

(54) SOLAR CELL MODULE, AND PRODUCTION METHOD FOR SOLAR CELL MODULE

(71) Applicant: SANYO Electric Co., Ltd., Daito-shi, Osaka (JP)

(72) Inventor: Masao Kouyanagi, Osaka (JP)

(73) Assignee: PANASONIC INTELLECTUAL PROPERTY MANAGEMENT CO., LTD. (JP)

( * ) Notice: Subject to any disclaimer, the term of this patent is extended or adjusted under 35 U.S.C. 154(b) by 0 days.

(21) Appl. No.: 14/616,366

(22) Filed: Feb. 6, 2015

(65) Prior Publication Data
US 2015/0222219 A1    Aug. 6, 2015

Related U.S. Application Data

(63) Continuation of application No. PCT/JP2013/005660, filed on Sep. 25, 2013.

(30) Foreign Application Priority Data

Sep. 28, 2012   (JP) .................................. 2012-217332

(51) Int. Cl.
| | |
|---|---|
| *H02S 20/20* | (2014.01) |
| *H02S 30/10* | (2014.01) |
| *H01L 31/042* | (2014.01) |
| *F24J 2/52* | (2006.01) |

(52) U.S. Cl.
CPC .............. *H02S 20/20* (2014.12); *H01L 31/042* (2013.01); *H02S 30/10* (2014.12); *F24J 2/526* (2013.01); *F24J 2/5211* (2013.01); *Y02E 10/50* (2013.01)

(58) Field of Classification Search
CPC ........ H02S 20/20; H02S 30/10; H01L 31/042
USPC .................................. 136/244, 252
See application file for complete search history.

(56) References Cited

U.S. PATENT DOCUMENTS

2011/0194886 A1*   8/2011   Wu ....................... E06B 3/9641
403/23

FOREIGN PATENT DOCUMENTS

| DE | 202008013005 U1 | 2/2010 |
|---|---|---|
| JP | S5370707 U | 6/1978 |
| JP | 60246981 A | 12/1985 |
| JP | 6132490 U | 2/1986 |
| JP | 2007095819 A | 4/2007 |

OTHER PUBLICATIONS

Extended European Search Report corresponding to Application No. 13842294.4-1504/2903035 PCT/JP2013/005660; Date of Mailing: Sep. 8, 2015.

(Continued)

*Primary Examiner* — Susan D Leong
(74) *Attorney, Agent, or Firm* — Cantor Colburn LLP (57) ABSTRACT

A solar cell module is configured from a solar cell panel, and a frame structural body. The frame structural body is provided with: a plurality of frame members which are provided to peripheral edges of the solar cell panel, and which have a cross-sectional shape having a hollow portion; corner members which are provided in the hollow portions; holding sections which are provided in the hollow portions, and which hold the corner members; and a plurality of formed rivet sections which apply pressure to the frame members.

6 Claims, 6 Drawing Sheets

(56) References Cited

OTHER PUBLICATIONS

International Preliminary Report on Patentability corresponding to Application No. PCT/JP2013/005660; Date of Mailing: Mar. 31, 2015.
Notification Concerning Transmittal of Copy of International Preliminary Report on Patentability and Notification of Transmittal of Copies of Translation corresponding to Application No. PCT/JP2013/005660; Date of Mailing: Apr. 9, 2015.
Second and Supplementary Notice Informing the Applicant of the Communication of the International Application corresponding to Application No. PCT/JP2013/005660; Date of Mailing: Jan. 29, 2015.
Written Opinion of the International Searching Authority corresponding to Application No. PCT/JP2013/005660; Date of Mailing: Nov. 26, 2013.
International Search Report corresponding to Application No. PCT/JP2013/005660; Date of Mailing: Nov. 27, 2013, with English translation.

* cited by examiner

SOLAR CELL MODULE, AND PRODUCTION METHOD FOR SOLAR CELL MODULE

TECHNICAL FIELD

The present invention relates to a solar cell module and a production method thereof.

BACKGROUND ART

A solar cell module is configured so that a plurality of solar cells are mutually serially connected via a plurality of wiring materials and a light-receiving surface side and a rear surface side are sandwiched between sealing materials, respectively, and the light-receiving surface side at the outer side and the rear surface side have protection members, respectively, and an end is fixed in a frame-like manner using a plurality of frame members.

In the case of the solar cell module as described above, a frame structural body is configured so that a fixation member called a corner piece is pressed into an attachment section of a corner section of each frame member to thereby join and fix the respective frame members (see, for example, Patent Document 1).

CITATION LIST

Patent Literature

Patent Document 1: Japanese Patent Laid-Open No. 2007-95819

Technical Problem

In the case of the solar cell module according to Patent Document 1, a method is disclosed according to which corner pieces are pressed into the frame members to fix the frame members, thus requiring a need to accurately provide the frame members at predetermined positions. Furthermore, when the effective connection between the frame members can be corrected, a frame structural body having sufficient strength cannot be obtained due to a corner piece being disengaged from the frame member, for example.

An objective of the present invention is to provide a solar cell module made in view of the above disadvantage, and a production method thereof.

SUMMARY OF INVENTION

A solar cell module according to the present invention includes: a solar cell panel; a plurality of frame members that are provided at the peripheral edge of the solar cell panel and that have a cross-sectional shape having a hollow portion; a corner member provided in the hollow portion; a holding section that is provided in the hollow portion and that holds the corner member; and a plurality of rivet sections formed by pressing the frame member.

The production method of the solar cell module according to the present invention includes: preparing a plurality of frame members having a cross-sectional shape having a hollow portion; inserting L-shaped corner members to the hollow portions of the two frame members; simultaneously pressing inner walls of the two frame members superposed on the corner member to form rivet sections in the two frame members, respectively; integrating the two frame members to form a corner portion; and using the plurality of frame members to form a frame of the solar cell panel.

Advantageous Effects of Invention

According to the above configuration, the corner member provided in the hollow cross-sectional portion of the frame member is used to press and fix the frame member and the corner member. Thus, the frame member and the corner member can be provided without requiring a high degree of accuracy. The plurality of frame members can be mutually fixed in a secure manner to support the peripheral edge of the solar cell panel.

BRIEF DESCRIPTION OF DRAWINGS

FIGS. 1A to 1C illustrate the configuration of a solar cell module in an embodiment of the present invention.

DESCRIPTION OF EMBODIMENTS

The following section will describe an embodiment of the present invention in detail with reference to the drawings. In the following description, identical or similar elements in all drawings are denoted with the same reference numerals and will not be further described.

Figure 1A:
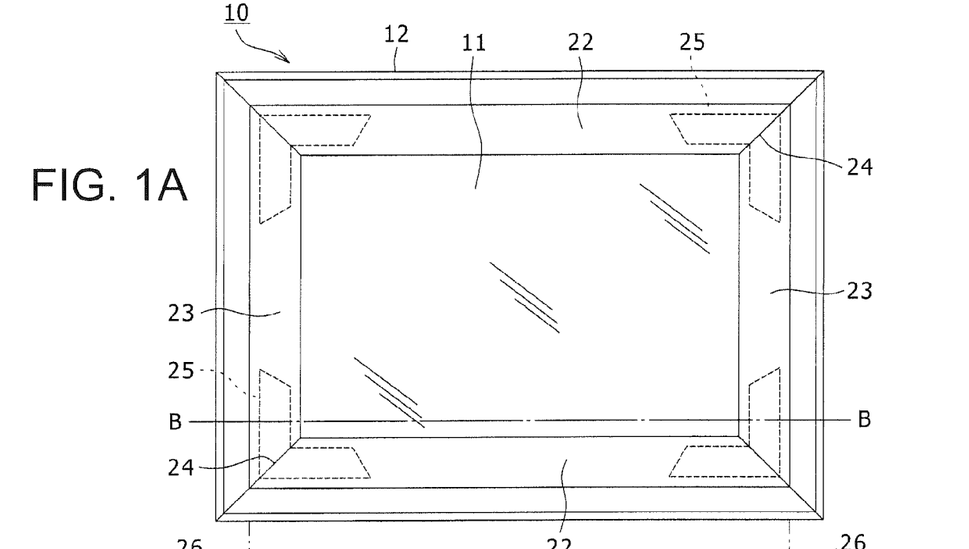
FIG. 1A is a plan view.
Figure 1B:
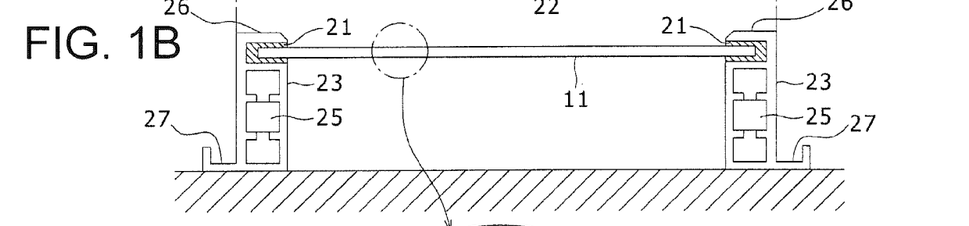
FIG. 1B is a cross-sectional view taken along B-B of FIG. 1A.
Figure 1C:
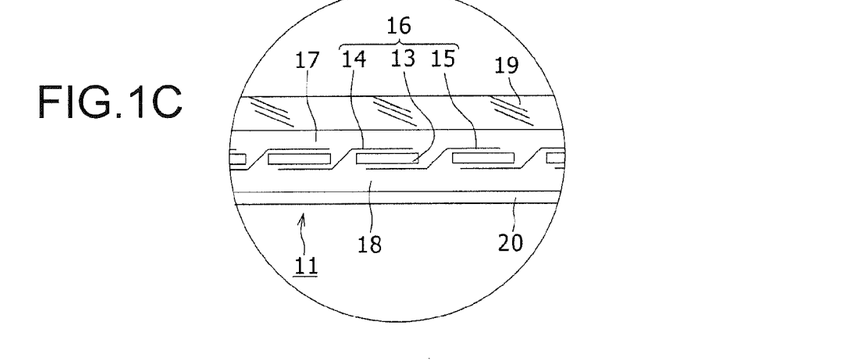
FIG. 1C is a cross-sectional view of the solar cell panel.

FIGS. 1A to 1C illustrate the configuration of a solar cell module 10. FIG. 1A is a plan view. FIG. 1B is a cross-sectional view taken along B-B of FIG. 1A. The solar cell module 10 is configured to include a solar cell panel 11, and a frame structural body 12 functioning as a frame to support the peripheral edge of the solar cell panel 11. FIG. 1C is an expanded view of the cross section of the solar cell panel 11.

The solar cell panel 11 has a solar cell string 16 in which a plurality of solar cells 13 are mutually connected by the wiring materials 14 and 15. The solar cell panel 11 is configured by sequentially layering a light-receiving surface-side protection member 19, a light-receiving surface side sealing material 17, the solar cell string 16, a rear surface side sealing material 18, and a rear surface-side protection member 20.

The solar cell 13 includes a photoelectric conversion unit that receives light such as sunlight to generate hole and electron photogenerated carriers. The photoelectric conversion unit has, for example, a substrate of semiconductor material (e.g., crystalline silicon (c-Si), gallium arsenide (GaAs), or indium phosphide (InP)). The photoelectric conversion unit has, in a broad sense, a pn junction structure. For example, a hetero junction of an n-type monocrystal silicon substrate and amorphous silicon can be used. In this case, the substrate of the light-receiving surface side has thereon a layered structure of an i-type amorphous silicon layer, a p-type amorphous silicon layer doped with boron (B), for example, and a transparent conducting film (TCO) composed of translucent conducting oxide of indium oxide ($In_2O_3$). The rear surface side of the substrate has a layered structure of an i-type amorphous silicon layer and an n-type amorphous silicon layer doped with phosphor (P), for example.

The photoelectric conversion unit may have structures other than the above one so long as a function to convert light such as sunlight to electricity is achieved. For example, a structure may be used that includes a p-type polycrystalline silicon substrate, an n-type diffusion layer formed at the light-receiving surface side, and an aluminum metal film formed at the rear surface side.

Each of the wiring materials 14 and 15 is a conductive member that is connected via an adhesive agent to a surface of a transparent conducting film on the photoelectric conversion unit. Each of the wiring materials 14 and 15 is a thin plate composed of metal conductive material such as copper. The thin plate may be substituted with a twisted wire-like member. The conductive material may include, as an alternative to copper, silver, aluminium, nickel, tin, gold, or an alloy thereof.

The adhesive agent may be thermosetting resin adhesive agent composed of acrylic, flexible polyurethane, or epoxy. The adhesive agent includes conductive particles. Conductive particles may be nickel, silver, gold-plated nickel, or tin-plated copper, for example. The adhesive agent also may be insulating resin adhesive agent. In this case, the mutually-opposing faces of the wiring materials 14 and 15 and the connection electrode are allowed to partially contact each other to secure an electric connection.

Each of the light-receiving surface side sealing material 17 and the rear surface side sealing material 18 is a member to fix the solar cell 13 between the light-receiving surface-side protection member 19 and the rear surface-side protection member 20. These sealing materials 17 and 18 are selected in consideration of heat resistance, adhesiveness, flexibility, formability, and durability, for example. The sealing materials 17 and 18 are made of material that is highly transparent and that allows light to pass therethrough without being absorbed or reflected. For example, polyethylene-base olefin resin or ethylene-vinyl acetate (EVA) may be used, for example. In addition, EEA, PVB, silicone-base resin, urethane-base resin, acrylic-base resin, or epoxy-base resin may also be used.

The light-receiving surface-side protection member 19 is a transparent plate or film through which exterior light can be introduced. The light-receiving surface-side protection member 19 may be a translucent member such as a glass plate, a resin plate, or a resin film.

The rear surface-side protection member 20 is made of transparent or light-reflecting material, depending on the specification of the solar cell module 10. When the transparent material is used, the rear surface-side protection member 20 may be formed by a glass plate, a polyethylene terephthalate (PET) sheet, or a complex sheet obtained by layering a plurality of types of plastic sheets. When the light-reflecting material is used, the rear surface-side protection member 20 may be formed by a white-colored polyethylene terephthalate (PET) sheet, a complex sheet obtained by layering a plurality of types of plastic sheets, or a structure obtained by layering a plastic sheet and a metal foil.

The frame structural body 12 of solar cell module holds the outer shape of the solar cell module 10 in a frame-like manner by combining a plurality of frame members. In the following description, unless otherwise specified, the frame structural body 12 of the solar cell module will be simply referred to as the frame structural body 12. When the solar cell module has a rectangular planar shape, a total of four frame members composed of two frame members 22 extending in one direction and two frame members 23 extending in a direction orthogonal to the one direction are allowed to have a rectangular frame shape, thereby providing the frame structural body 12. The upper part of each of the frame members 22 and 23 has a concave section 21 in which the peripheral edge of the solar cell panel 11 is inserted and is fixed by adhesive agent, for example, for support.

Figure 2:
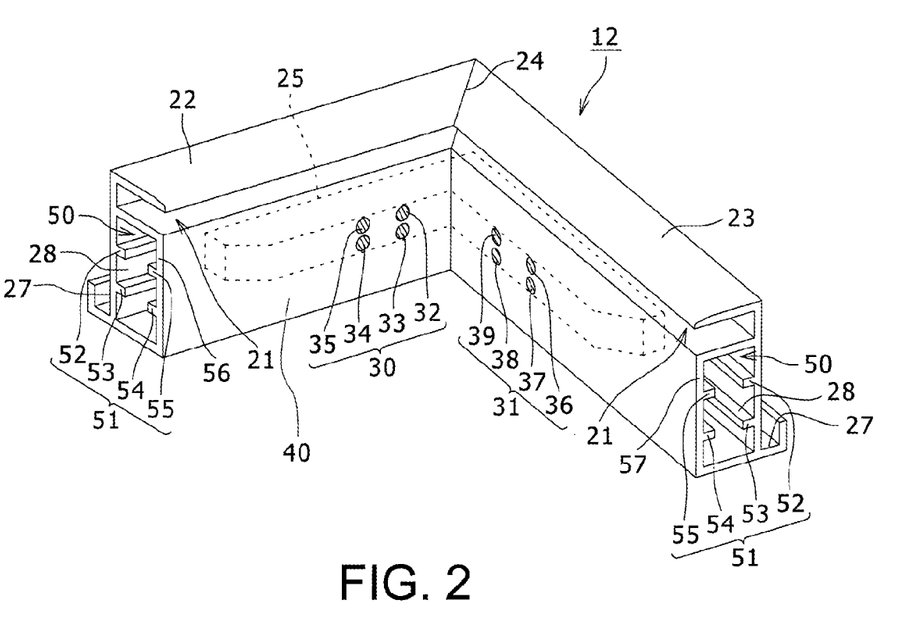
FIG. 2 illustrates a configuration of a frame structural body of the solar cell module in an embodiment of the present invention.

FIG. 2 is a perspective view of a part of the frame structural body 12 illustrating one corner portion among four corner portions of the frame structural body 12 assembled in a rectangular frame-like manner. The other three corner portions have a similar structure except for the direction of the coordinate axis. Thus, this one corner portion will be used to describe the connection structure of the frame members 22 and 23 of the frame structural body 12.

The frame structural body 12 is configured so that two frame members 22 and 23 are abutted at an abutting section 24 to form a corner portion. More specifically, one leg section of an L-shaped corner member 25 is inserted to the hollow portion 50 of the frame member 22 and the other leg section is inserted to the hollow portion of the hollow portion 50 of the frame member 23. Then, the corner member 25 of the frame members 22 and 23 is pressed and deformed to form and fix a rivet section 30 and a rivet section 31. In the following description, an operation to press a part of a member to cause the deformation of the member to fix two or more members will be called "riveting." A press dent due to the deformation by this riveting will be called a "rivet section." The rivet section 30 is composed of four dents 32, 33, 34, and 35 and the rivet section 31 is composed of four dents 36, 37, 38, and 39.

The rivet sections 30 and 31 are not visible from the light-receiving surface of the solar cell module when the solar cell module is attached with the frame structural body 12. Thus, the rivet sections 30 and 31 are formed in inner walls 56 and 57 of the frame members 22 and 23. Each of the inner walls 56 and 57 of the frame members 22 and 23 is a wall face extending along the peripheral edge of the solar cell panel 11.

Each of the frame members 22 and 23 is a long member configured to have a cross-sectional shape having the hollow portion 50 by subjecting metal material such as aluminum alloy to a drawing molding using a forming die to subject the surface to processing to provide weather resistance such as water resistance. When the frame structural body 12 is configured depending on the size of the rectangular shape of the frame structural body 12 and using the frame member 22 and the frame member 23, the long member is cut in an inclined manner so that the end faces of the frame member 22 and the frame member 23 have contact to each other, thereby forming the frame member 22 and the frame member 23.

The abutting section 24 is a part combined so that the longitudinal direction of the frame member 22 is orthogonal to the longitudinal direction of the frame member 23. In the abutting section 24, one end of the frame member 22 is cut in an inclined manner to the longitudinal direction and one end of the frame member 23 is cut in an inclined manner at an angle obtained by deducting a predetermined angle from 90 degrees with regard to the longitudinal direction. When the predetermined angle is 45 degrees, the one end of the frame member 22 and the other end of the frame member 23 are both cut in an inclined manner at an angle of 45 degrees with respect to the longitudinal direction.

Each of the frame members 22 and 23 has a main body 40 and a fixation section 26 forming a concave section 21 together with the main body 40. The main body 40 has the hollow portion 50 in the cross-sectional shape in order to provide both rigidity and light weight. The frame members 22 and 23 can have a collar section 27 used for fixation.

A holding section 51 is a convex section that is provided in the inner wall of the main body 40 and that extends in the longitudinal direction of the frame members 22 and 23. The holding section 51 is composed of four ribs 52, 53, 54, and 55 of the main body 40 to form an insertion section 28 surrounded by the four ribs 52, 53, 54, and 55. The corner member 25 has a cross-sectional shape smaller than the size of the insertion section 28 to allow the corner member 25 to be easily inserted to the insertion section 28 of frame members 22 and 23 and to provide the fixation by riveting of the corner member 25 and the frame members 22 and 23. The size of the insertion section 28 is defined by the size of the corner member 25 and can be reduced by providing the corner member 25 having a lighter weight. The existence of the holding section 51 allows the frame members 22 and 23 to have a rectangular frame-like shape having improved rigidity, thus suppressing a reduction in rigidity due to the frame members 22 and 23 having a lighter weight.

The corner member 25 is a member that is inserted into the hollow portion 50 of the two frame members 22 and 23. The corner member 25 has an L-like shape to correspond to the abutting section 24 at which the two frame members 22 and 23 have longitudinal directions orthogonal to each other. The corner member 25 as described above may be obtained by subjecting a metal material such as aluminum alloy to extrusion molding, for example, to provide a long member have an L-like shape to cut the member to have a predetermined thickness. The corner member 25 can have a cross-sectional area slightly smaller than that of the hollow portion 50 of the insertion section 28. As a result, the two frame members 22 and 23 can be more effectively prevented from having a defective connection due to burrs, for example. Burrs mean excessive material attached to a side of a workpiece during a step such as cutting or press fitting. The corner member 25 has a cross-sectional area set to be 75% or less (or preferably 50% or less) of the cross-sectional area of the hollow portion 50.

The following section will describe in detail the procedure to assembly the frame structural body 12 as described above with reference to FIG. 3 to FIG. 5.

First, the frame member 22 is prepared. One end of the frame member 22 is cut at the abutting section 24 in an inclined manner at an angle of 45 degrees. Next, the corner member 25 is prepared.

Figure 3:
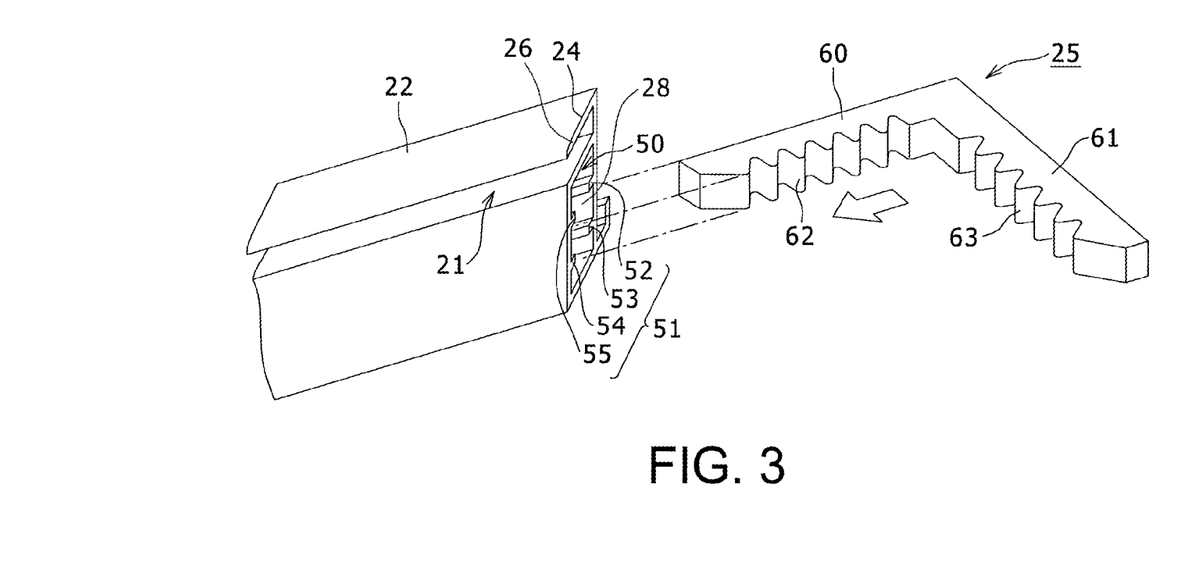
FIG. 3 illustrates a procedure to assemble the frame structural body of the solar cell module in an embodiment of the present invention in which one end of the corner member is inserted to one end of one frame member.

As shown in FIG. 3, the corner member 25 is an L-like member having one side leg section 60 and another side leg section 61 that extend in directions orthogonal to each other. The one side leg section 60 is configured so that an L-shaped inner side face includes a plurality of teeth 62. Similarly, the other side leg section 61 is configured so that an L-shaped inner side face includes a plurality of teeth 63. The existence of these teeth 62 and 63 allows the frame members 22 and 23 to be easily deformed during the formation of the rivet sections 30 and 31, thus providing secure fixation by riveting.

After the preparation of the corner member 25, the one side leg section 60 of the corner member 25 is inserted to the one end hollow portion 50 of the frame member 22 as shown in FIG. 3. The one side leg section 60 of the corner member 25 is inserted in the direction shown by the white arrow (the direction in which the frame member 22 extends) by being provided in the insertion section 28 by the four ribs 52, 53, 54, and 55 of the hollow portion 50 of the frame member 22.

Figure 4:
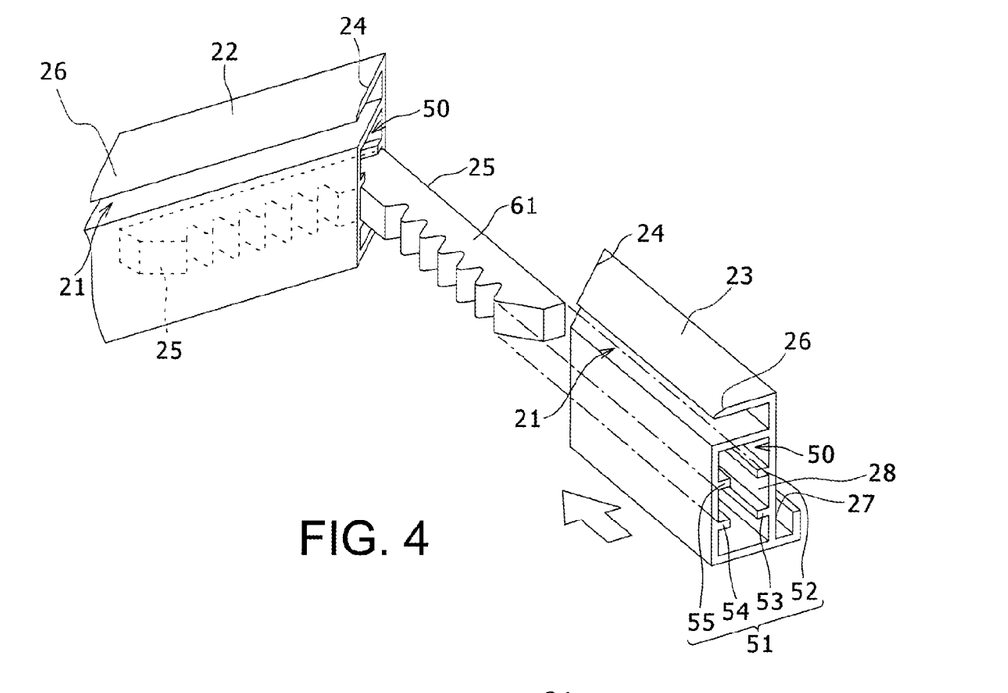
FIG. 4 illustrates a procedure continuing from FIG. 3 in which the other end of the corner member is inserted to the other end of the other frame member.

Next, as shown in FIG. 4, the other side leg section 61 of the corner member 25 in which the one side leg section 60 is inserted to the hollow portion 50 of the frame member 22 is inserted to the frame member 23. The frame member 23 is moved in the direction shown by the white arrow (the direction in which the other side leg section 61 extends) by placing the other side leg section 61 of the corner member 25 in the insertion section 28 by the four ribs 52, 53, 54, and 55 of the hollow portion 50 of the other end of the frame member 23.

The corner member 25 is inserted to the hollow portion 50 of the frame members 22 and 23 until the frame member 22 is abutted to the frame member 23. As a result, the frame member 23 is moved along the other side leg section 61 of the corner member 25 to reach the position of the abutting section 24 of the frame member 22 at which the frame member 23 is abutted to the abutting section 24.

Figure 5:
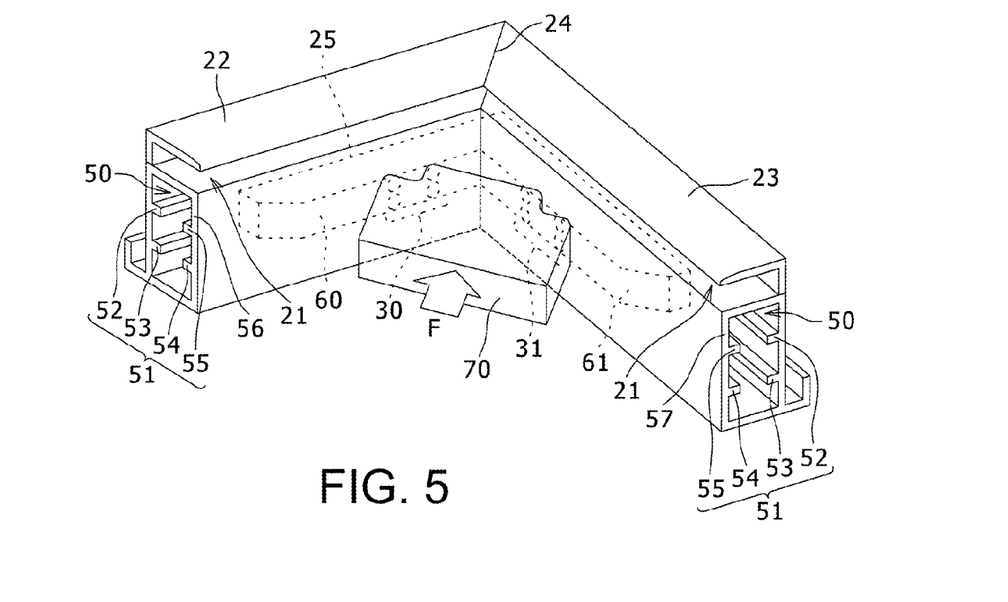
FIG. 5 illustrates a procedure continuing from FIG. 4 in which a rivet jig is used to fix the two frame members and the corner member while allowing the two frame member to be abutted to each other.

As described above, the corner member 25 is provided by being inserted to the hollow portions 50 of the two frame members 22 and 23. In this status, as shown in FIG. 5, a riveting jig 70 is used to rivet the frame members 22 and 23 by pressing. The rivet jig 70 is a tool configured to have a convex planar shape and a predetermined thickness. Four corner portions opposed to the frame members 22 and 23 have convex sections provided at the total of 8 positions at the upper side and the lower side in the thickness direction, respectively. The rivet jig 70 is positioned so that the eight convex sections are substantially simultaneously abutted to the inner walls 56 and 57 of the frame members 22 and 23. While using the outer wall of the frame members 22 and 23 as a fixation side, the rivet jig 70 is pressed at a predetermined pressure in a direction shown by the white arrow (a direction extending from the center of the solar cell panel to the corner portions) to perform riveting. As a result, the rivet sections 30 and 31 are formed by a single step.

Figure 6:
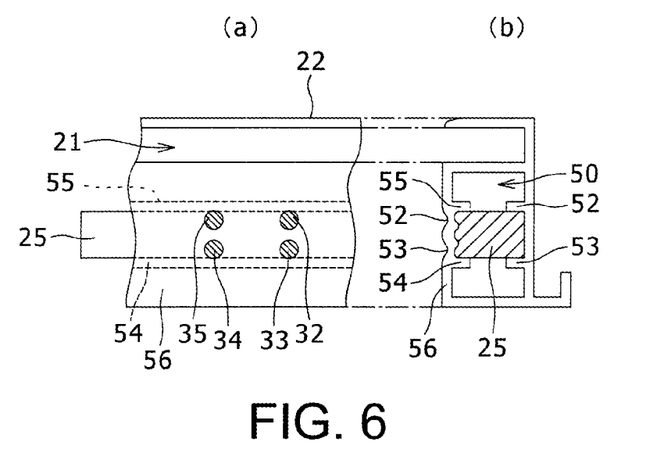
FIG. 6 illustrates a rivet section of the frame structural body of the solar cell module in an embodiment of the present invention.

FIGS. 6(a) and 6(b) show the details of the four dents 32, 33, 34, and 35 of the rivet section 30 in the frame member 22. FIG. 6 (a) is a front view seen from the inner wall 56 of the frame member 22. FIG. 6(b) is a cross-sectional view of positions at which the dents 32 and 33 are formed. The dents 32, 33, 34, and 35 are not superposed with the ribs 54 and 55 and are formed in the inner wall 56 of the frame member 22 superposed with the one side leg section 60 of the corner member 25. By positioning the dents 32, 33, 34, and 35 as described above, the deformation of the frame member 22 due to the formation of the dents 32, 33, 34, and 35 can be limited substantially within a range of a region between the rib 54 and the rib 55, thus suppressing the solar cell module 10 from having a damaged appearance. Furthermore, the pressing for riveting is performed in a direction from the center of the solar cell panel to the corner portions. Thus, the formed dents 32, 33, 34, and 35 can have an inclined side wall to the pressed face of the frame member 22. This consequently suppresses the corner member 25 from disengaging.

Figure 7:
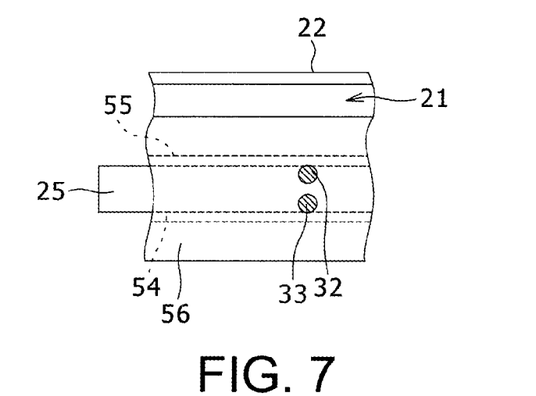
FIG. 7 illustrates another example of the rivet section.

In the above description, the rivet section 30 is configured by four dents. However, the number of dents constituting the rivet section 30 may be increased or reduced depending on the specification of the frame structural body 12. FIG. 7 illustrates an example in which the rivet section 30 is configured by the two dents 32 and 33 arranged in a longitudinal column.

Figure 8:
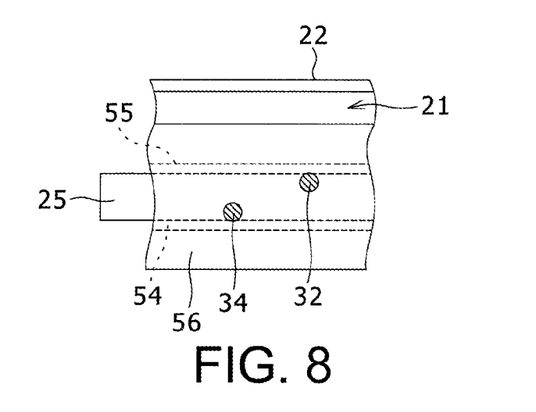
FIG. 8 illustrates another example of the rivet section.

FIG. 8 shows an example in which the rivet section 30 is configured by the two dents 32 and 34 arranged in an inclined manner to the corner member 25.

In the above description, the rivet section 30 is provided so as not to be superposed with the ribs 54 and 55. However, if the riveting strength is prioritized, an interval between the convex sections in the longitudinal direction is preferably increased so that the rivet section 30 is superposed with the ribs 54 and 55.

Figure 9:
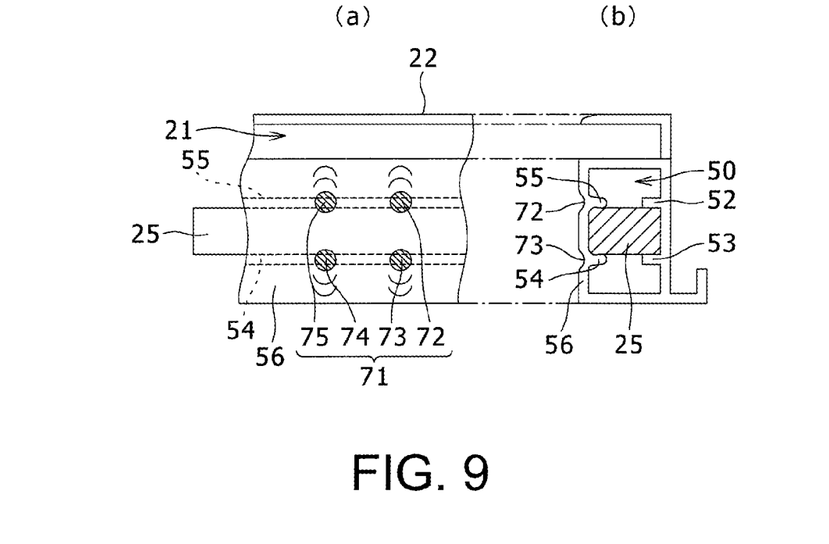
FIG. 9 shows an example in which the holding section of the frame member and the corner member are riveted so as to be superposed to each other.

FIGS. 9(*a*) and 9(*b*) shows an example in which dents 72, 73, 74, and 75 of the rivet section 30 in the frame member 22 are provided at positions at which the ribs 54 and 55 are superposed with the corner member 25. FIG. 9(*a*) is a front view seen from the inner wall 56 of the frame member 22. FIG. 9(*b*) is a cross-sectional view showing the positions at which the dents 72 and 73 are formed.

As shown in FIG. 9(*b*), the rib 54 and the rib 55 deform so as to sandwich the corner member 25. Thus, a portion superposed with the rib 54 and the corner member 25 or a portion superposed with the rib 55 and the corner member 25 is pressed to form the dents 72, 73, 74, and 75. As a result, the frame member 22 and the corner member 25 can be fixed more strongly than in a case where riveting is performed on a portion not superposed with the ribs 54 and 55 and superposed with the one side leg section 60 of the corner member 25 only. When the inner wall 56 of the frame member 22 only superposed with the ribs 54 and 55 is pressed to form a rivet section, the frame member 22 has increased deformation, thus easily causing wrinkles in the frame 22. Thus, from the viewpoint of the appearance of the solar cell module 10, the inner wall 56 of the frame member 22 superposed with the corner member 25 is preferably at least partially pressed to form a rivet section.

In the above example, the cross-sectional shape of the frame member, the corner member shape, and the number of dents of rivet sections are illustrated for description and can be appropriately changed depending on the specification of the frame structural body of the solar cell module.

INDUSTRIAL APPLICABILITY

The present invention can be applied to a solar cell module and a production method thereof.

The invention claimed is:

1. A solar cell module, comprising:
   a solar cell panel;
   a plurality of frame members that are provided at the peripheral edge of the solar cell panel and that have a cross-sectional shape having a hollow portion;
   a corner member provided in the hollow portion;
   a holding section that is provided in the hollow portion and that holds the corner member; and
   a plurality of rivet sections formed by pressing the frame member.

2. The solar cell module according to claim 1, wherein: the plurality of rivet sections are provided on an inner wall of the frame member.

3. The solar cell module according to claim 2, wherein: the plurality of rivet sections are configured so that a dent is formed in the inner wall of the frame member superposed with the corner member.

4. The solar cell module according to claim 2, wherein: the plurality of rivet sections are provided in the inner wall of the frame member superposed with the holding section of the frame member and the corner member.

5. The solar cell module according to any one of claims 1 to 4, wherein: the corner member is smaller than an insertion section surrounded by the holding section.

6. A production method of a solar cell module comprising:
   preparing a plurality of frame members having a cross-sectional shape having a hollow portion and inserting L-shaped corner members to the hollow portions of the two frame members;
   simultaneously pressing inner walls of the two frame members superposed on the corner member to form rivet sections in the two frame members, respectively; and
   integrating the two frame members to form a corner portion; and using the plurality of frame members to form a frame of the solar cell panel.

* * * * *